United States Patent [19]
Schulze-Kahlayss et al.

[11] Patent Number: 5,643,401
[45] Date of Patent: Jul. 1, 1997

[54] SPLICING AID FOR CONNECTING COMPONENT BELTS

[75] Inventors: Rainer Schulze-Kahlayss, Röttenbach; Robert Hierl, Freudenberg, both of Germany

[73] Assignee: Siemens Aktiengesellschaft, München, Germany

[21] Appl. No.: 387,940
[22] PCT Filed: Aug. 20, 1993
[86] PCT No.: PCT/DE93/00764
§ 371 Date: Feb. 27, 1995
§ 102(e) Date: Feb. 27, 1995
[87] PCT Pub. No.: WO94/05143
PCT Pub. Date: Mar. 3, 1994

[30] Foreign Application Priority Data

Aug. 25, 1992 [DE] Germany ............... 9211415 U

[51] Int. Cl.[6] ................................................. B31F 5/06
[52] U.S. Cl. .................... 156/505; 206/582; 206/813
[58] Field of Search .............................. 156/157, 159, 156/502, 505, 506, 509; 206/582, 813

[56] References Cited

U.S. PATENT DOCUMENTS

| | | | |
|---|---|---|---|
| 2,994,362 | 8/1961 | Hall | 156/505 |
| 3,082,866 | 3/1963 | Kessman | 156/505 X |
| 3,475,263 | 10/1969 | Kapilow et al. | 156/505 X |
| 3,546,046 | 12/1970 | MacQueston | 156/505 |
| 3,914,491 | 10/1975 | Takahashi | 156/505 X |
| 4,180,431 | 12/1979 | Gelardi | 156/505 |
| 4,254,865 | 3/1981 | Pacey et al. | 206/316 |
| 4,390,389 | 6/1983 | Bunas et al. | 156/502 |
| 4,398,982 | 8/1983 | Witerski et al. | 156/157 |
| 5,078,828 | 1/1992 | Marglin | 156/505 |

FOREIGN PATENT DOCUMENTS

3311634A1  10/1984  Germany.
676703  2/1991  Switzerland.

*Primary Examiner*—James Sells
*Attorney, Agent, or Firm*—Kenyon & Kenyon

[57] ABSTRACT

A splicing aid for connecting belts having a lateral track of guide holes with grid dimensions. The splicing aid includes a carrier with at least two parallel tracks. A first track has knobs with the same grid dimensions as the guide holes of the belt. A second track has at least one detachable adhesive strip. The carrier, with its knobs, serves as a splicing aid and is subsequently pulled off. When splicing aids of this kind are used no additional aids are required.

26 Claims, 2 Drawing Sheets

SPLICING AID FOR CONNECTING COMPONENT BELTS

BACKGROUND OF THE INVENTION

The present invention relates to a splicing aid for connecting component belts, preferably belts which house electronic SMDs (Surface Mounted Devices) and which feed the components to "pick-and-place" component handlers or the like, the belts having regularly spaced guide holes in a lateral track.

Printed circuit boards are usually fitted with components, in particular with electronic SMDs, using automatic component fitting machines operating according to the so-called "PICK-AND-PLACE" principle. To permit a high fitting speed, the components are ready made in belts, for example with so-called plastic blister packing or in stable cardboard strips having recesses, and are fed to the pick-and-place component handler head. With such belts, the machine can be continuously operated for the most part. However, problems frequently occur at the end of the belt, when the end of a first belt has to be connected to (i.e., "spliced to") the start of a second belt.

Splicing aids have been proposed in which one belt end and one start of a belt are fixed with their guide holes in pins. Splicing is then achieved by laying a first adhesive strip underneath the abutting belt sections and by laying a second adhesive strip above the abutting belt sections. Adhesive strips of this kind are constructed, for example, as special adhesive strips with divided carrier material having guide holes with the grid dimensions of the pins of the aid.

Unfortunately, the previously known device is comparatively awkward to handle. Consequently, in practice the component belts are frequently connected (spliced) manually without an aid. However, faults are inevitably associated with manually produced splices because of imprecise grid dimensions, because of a laterally protruding adhesive strip and/or because the belts become twisted or angled with respect to one another.

The object of the present invention is to provide a splicing aid for connecting component belts which does not require additional aids and which permits the component belts to be connected in a practical way.

SUMMARY OF THE INVENTION

The above mentioned object is achieved with a splicing aid according to the present invention which provides a carrier with at least two parallel tracks, one track of which has knobs with the same grid dimension as the guide holes of the belt, and the other track has a detachable adhesive strip. Preferably, the knobs and the adhesive strip are located on the same surface side of the carrier. The carrier of the present invention comprises a material which is suitable for having knobs punched into it, in particular relatively strong paper or plastic. With such a splicing aid, precise grid dimensions and a laterally exact seating of the adhesive strip is always ensured if the aid is properly used.

Preferably, with a splicing aid according to the present invention, applying two parallel tracks with adhesive strips on the carrier for arrangement on both sides of the belt is also possible. Here, a bending fold or a thinning in the material is already present in the carrier between the two tracks with adhesive strips. In this way, application of the splicing aid is further simplified and thus permits a more rapid connection (splicing) of the end of one belt and the start of another belt. At the same time, knobs may be present with the same grid dimension as the guide holes of the belt on both tracks of the carrier adjacent to, and outside of, the adhesive strips. Such a symmetrically designed splicing aid further facilitates its use for belt component splicing.

The splicing aid according to the present invention can advantageously be used for component belts which comprise stable paper or cardboard with recesses in which the components are inserted. Moreover, the splicing aid according to the present invention can also be used with belt material made of plastic, and in particular wider belts with embossed pockets, i.e. so-called "blister packs". For example, both ends of the belts can be pressed, pocket in pocket, after two components are removed from the new belt. Furthermore, with the splicing aid according to the present invention, adhesive strips can be applied on both sides of the belt without bending around the carrier.

The present invention is particularly advantageous because mechanical aids can now be completely dispensed with. The splicing aid according to the present invention can be used in magazines, for example in rolls or the like, because commercially available dispensers can be used to cut individual strips to size. Alternatively, individual splicing aids can be cut ready to length and marketed ready made in bags as bulk goods or the like.

BRIEF DESCRIPTION OF THE DRAWINGS

Further details and advantages of the present invention emerge from the subsequent description of the figures of the exemplary embodiment.

DETAILED DESCRIPTION

Figure 1:
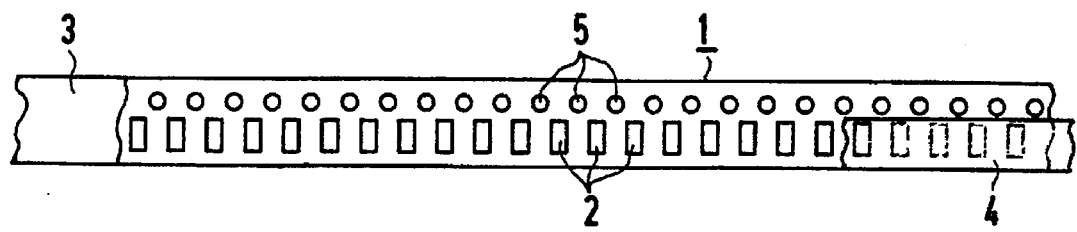
FIG. 1 is a plan view of a portion of a component belt.

In FIG. 1, 1 designates a component belt for use in pick-and-place component handlers. Such a component belt 1 comprises, for example, sturdy paper and has individual pockets 2 arranged one behind the other in the direction of the belt. Contact wire-less components (SMDs) can be inserted into the pockets 2. The underside of the component belt 1 is lined with a thin carrier paper 3 and the upper side of the component belt 1 is provided with a customary transparent pull-off film 4 after the components are inserted into the pockets 2.

The carrier belt 1 for SMDs usually has guide holes 5 in a lateral track. The guide holes 5 are arranged in a grid which is dimensioned to permit suitable transport control of the belt 1. When a new belt ends, at the start of a second belt, the end of the first belt and the start of the second belt must engage one in the other without a gap in the components (i.e., such that the spacing between the pockets 2 is maintained). For this purpose, the prior art discusses aids for temporarily securing the ends of the belts while appropriate adhesive strips are applied on both sides. In each case, special adhesive strips with separated carrier material are necessary which complicate the overall handling.

Figure 2:
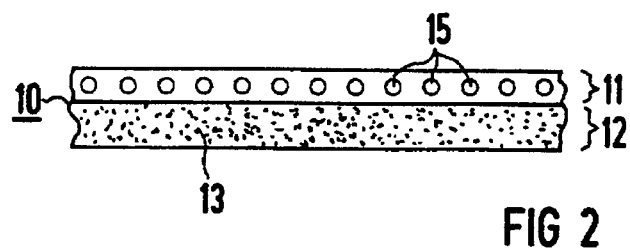
FIG. 2 is a plan view of a connecting aid of the present invention to be applied to both sides of the component belt.

FIG. 2 is a plan view of a belt-shaped splicing aid for replacing the aids discussed in the prior art. The belt-shaped splicing aid comprises a flexible carrier 10 which has two parallel tracks, specifically a first track 11 and a second track 12. Knobs (or protrusions) 15 are provided on the first track. The spacing between the knobs 15 corresponds to the grid dimensions of the guide holes 5 of the component belt 1. A tear-off adhesive strip 13 is applied in the second track 12. The tear-off adhesive strip 13 is an adhesive film which is detachably connected to the carrier by its non-adhesive underside by means of ultrasound or the like. The adhesive layer is thus located on the upper side (i.e., the side away from the carrier 10) of the tear-off adhesive strip 13. A protective film or the like can be applied to the adhesive layer of the tear-off adhesive strip 13 before use.

When applied as a splicing aid, the knobs 15 of the flexible carrier 10 precisely engage the guide holes 5 of the belt 1. The knobs 15 with the prescribed grid dimensions permit the predetermined grid dimensions to be maintained even when the ends of the belt are manually handled. Thus, specific aids, such as those discussed in the prior art (e.g., pins) for example, are superfluous. After it is used as a splicing aid, the carrier 10 can be pulled off and discarded leaving behind the tear-off adhesive strip on the belt 1.

Figure 3:
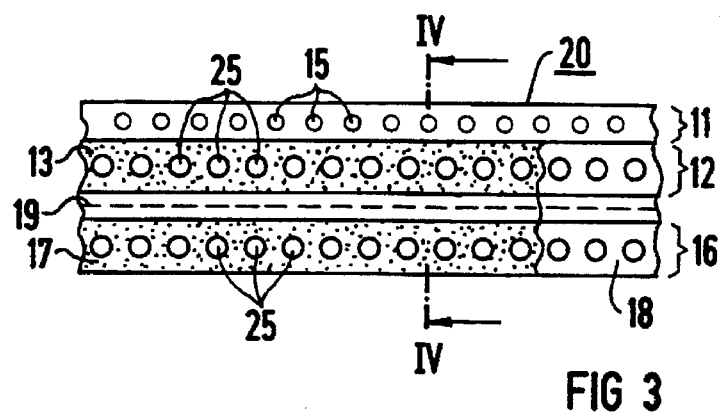
FIG. 3 is a plan view of a connecting aid of the present invention which can be applied to both sides of the component belt.
Figure 4:
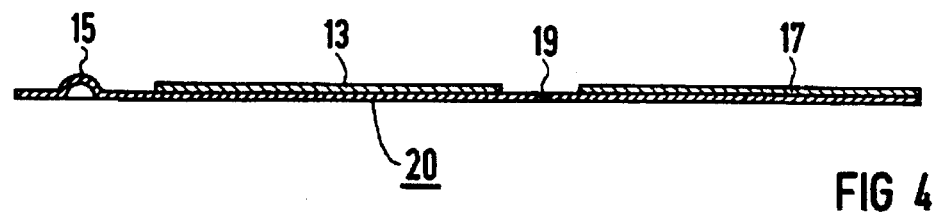
FIG. 4 is an enlarged side sectional view along the line IV—IV in FIG. 3.

In FIG. 3, the splicing aid according to FIG. 2 with a carrier 20 is modified such that, in addition to the track 12 with the adhesive strip 13, a further track 16 with a further adhesive strip 17 is present. Here, the tracks 12 and 16 are separated by a free part of the carrier 20 in which a bending fold 19 or another thinning in the material, such as perforation or the like is provided. The bending fold 19 is clearly shown in the sectional view of FIG. 4.

The adhesive strips 13 and 17 can also have holes 25 with the grid spacing. This carrier 20 is appropriate if during the application, according to the specifications, of pick-and-place component handlers, so-called component ejectors are used which require an engagement through bonded components or the like.

The splicing aids according to the present invention are provided in magazine form as an endless tape on a roller or the like, customary cutting-to-size devices for film strips being used.

The splicing aids according to FIG. 2 and/or FIG. 3/4 are used as follows. Initially, the ends of two component belts to be connected are each cut through in the center of a guide hole 5. Next, a splicing adhesive strip from the commercially available dispenser is pulled off at a length of approximately 40 mm and removed. The knobs 15 of the splicing adhesive strip are pressed into the belt guide holes 5. Consequently, the start and the end of two belts are precisely fixed both in terms of grid dimensions and in terms of position. The adhesive strip 13 is pressed onto the first side of the two belts. Then, in a splicing aid according to FIG. 2, the carrier material 10 is pulled off and discarded. The same process is then carried out on the opposite side of the belts. With a splicing aid according to FIG. 3/4, the carrier 20 is bent around the belts and the second adhesive strip 17 is pressed onto the opposite side of the belts. The carrier material 20 is now pulled off and discarded in a corresponding manner. The ends of the belts are thus connected precisely in terms of grid dimensions and position in the shortest possible way without requiring an aid.

Figure 5:
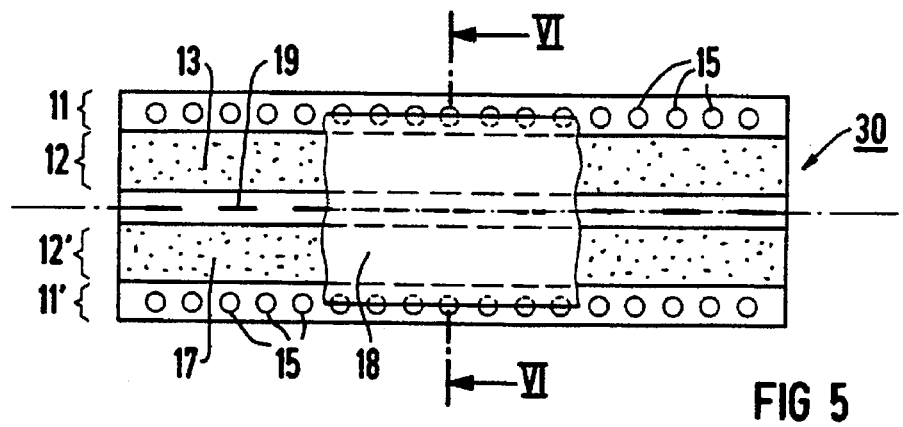
FIG. 5 is a plan view of a connecting aid according to FIG. 3 which is of symmetrical design.

In FIG. 5, a ready-cut carrier 30 is present which has for example the length of 4 to 5 cm. The carrier 30 is of symmetrical design in this case and starting from the line of symmetry has, in each case, tracks 12 and 11 and 12' and 11' corresponding to a perforation cut 19'. One adhesive strip 13 and 17 according to FIG. 3 is on each of the inner tracks 12 and 12', respectively. An identical arrangement of knobs 15 is present on each of the outer tracks 11 and 11'. The upper side of the ready-cut connecting aids can be covered with a protective film 18 which can advantageously extend as far as the knobs 15. The protective film 18 can be removed just before the splicing aid is applied.

Figure 6:
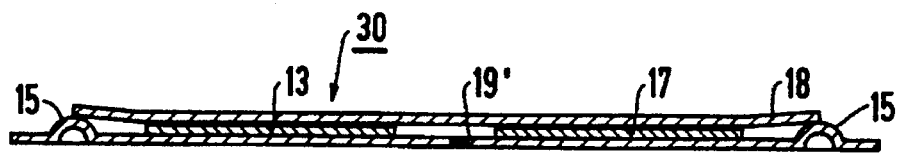
FIG. 6 is an enlarged side sectional view along the line VI—VI in FIG. 5.

The layer structure with the carrier layer 30, the two adhesive strips 13 and 17 and the protective film 18 can be seen in detail in the side view of FIG. 6. Providing the undersides of the adhesive strips 13 and 17 with a lightweight adhesive film having a lower adhesion than on the upper side of the adhesive strips is suitable. Instead of the concrete thinning in the material 19 in FIG. 3, the same objective can be achieved by means of a prepunching (or perforated cut) 19'.

In particular, the symmetrical design of the connecting aid according to FIGS. 5 and 6 permits it to be used in a direction-independent fashion. Moreover, the connecting aid according to FIGS. 5 and 6 can be utilized in SMD belts. The connecting aids which can be used for such an application independently of the type and manufacturer of the pick-and-place component handlers and which can be referred to globally as "SMD double splice tape" are preferably supplied as bulk material in bags, for example of 100 or 500 items and are thus available ready made as supply material for continuous operation of the pick-and-place component handlers.

Figure 7:
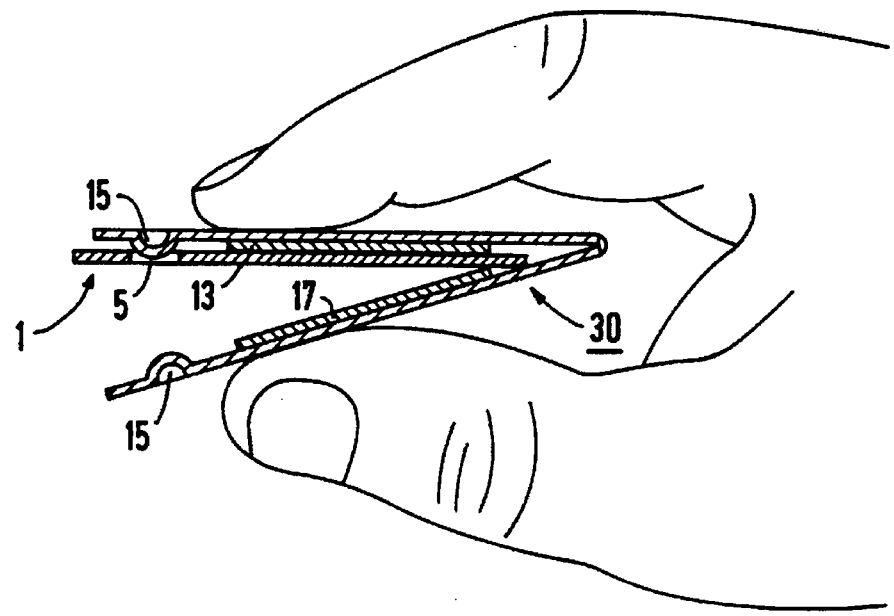
FIG. 7 illustrates the proper application of the connecting aid according to FIGS. 5 and 6.

The proper application of the connecting aid according to FIGS. 5 and 6 is illustrated in FIG. 7. As FIG. 7 clearly illustrates, the pressing of the knobs 15 into the guide holes 5 of belt ends to be connected and the subsequent pressing tight of the first adhesive strip 13 can be easily carried out by hand. After the carrier 30 is folded along the fold line 19, the identical process takes place from the underside of the belt 1. By virtue of the counter pressure of the lower knobs 15 into the guide holes 5, the upper carrier part with the knobs 15 can move out of the guide holes 5 and, in the same way, become detached from the adhesive strip 13 because of the relatively low adhesion on the back of the adhesive strip 13. After the lower adhesive strip 17 is pressed onto the belts, the entire carrier 30 is pulled off by means of the free upper carrier part.

The described splicing aids can also be used in belt material made of plastic and/or wide belts. If pockets which have been embossed as blisters are present, both belt ends are pressed, pocket in pocket, after the removal of, in each case, two components from the new belt. Subsequently, an adhesive strip is applied on both sides according to FIG. 2, thus securely fixing both belts.

We claim:

1. A splicing aid for connecting component belts having guide holes with grid dimensions arranged in a lateral track, the splicing aid comprising a carrier, the carrier having at least two parallel tracks, a first track of the at least two parallel tracks having knobs with the same grid dimensions as the guide holes of the belt and a second track of the at least two parallel tracks having at least one detachable adhesive strip, wherein the first track abuts the second track and the first track is free of adhesive.

2. The connecting aid of claim 1 wherein the knobs and the at least one detachable adhesive strip are located on the same surface side of the carrier.

3. The splicing aid of claim 1 further comprising a protective film, the protective film covering an outer layer of the at least one detachable adhesive strip and adapted to be pulled off before applying the splicing aid.

4. The splicing aid of claim 1 wherein the at least one detachable adhesive strip has holes with grid dimensions for engagement of component ejectors in pick-and-place component handlers.

5. The connecting aid of claim 1 wherein the knobs are formed by stamping the carrier.

6. The connecting aid of claim 1 wherein the carrier is a film.

7. The connecting aid of claim 1 wherein the carrier is a sturdy paper.

8. The connecting aid of claim 1 wherein the at least one detachable adhesive strip is an adhesive film which is attached to the carrier in a pull-off fashion, the adhesive film having a non-adhesive side on the carrier.

9. The connecting aid of claim 1 wherein the at least one detachable adhesive strip is attached on the carrier by means for attaching.

10. The connecting aid of claim 9 wherein the means for attaching is ultrasonic welding.

11. The connecting aid of claim 1 wherein the at least one detachable adhesive strip is attached on the carrier with less adhesion than on its upper side facing away from the carrier.

12. The connecting aid of claim 1 wherein the carrier is provided in a magazine as a belt on a roller and is cut to size as strips as required.

13. The connecting aid of claim 1 wherein the carrier is ready made to a suitable length.

14. A splicing aid for connecting component belts having guide holes with grid dimensions arranged in a lateral track, the splicing aid comprising a carrier, the carrier having at least three parallel tracks, a first track of the at least three parallel tracks having knobs with the same grid dimensions as the guide holes of the belt, said first track being free of adhesive and each of a second track and a third track of the at least three parallel tracks having at least one detachable adhesive strip, one of said second and third tracks abutting the first track, the second and third tracks being arranged on both sides of a thinning in the material of the carrier thereby permitting the second and third tracks to be arranged on both sides of the belt.

15. The splicing aid of claim 14 wherein a bending fold is defined in the carrier between the second and third tracks thereby permitting the simultaneous application of the adhesive strip of the third track on the underside of the belt precisely in terms of position and grid dimensions by bending the carrier, at the fold, around an edge of the belt.

16. The splicing aid of claim 14 wherein knobs are present on a fourth track with the grid dimensioning of the guide holes of the belt, wherein the first and fourth tracks of the carrier having knobs, are adjacent to and outside of the second and third tracks having the adhesive strips, respectively.

17. The splicing aid of claim 14 further comprising a protective film, the protective film covering an outer layer of each of the adhesive strips and adapted to be pulled off before applying the splicing aid.

18. The splicing aid of claim 14 wherein the detachable adhesive strips have holes with grid dimensions for engagement of component ejectors in pick-and-place component handlers.

19. The splicing aid of claim 14 wherein the knobs are formed by stamping the carrier.

20. The splicing aid of claim 14 wherein the carrier is a film.

21. The splicing aid of claim 14 wherein the carrier is a sturdy paper.

22. The splicing aid of claim 14 wherein the detachable adhesive strips are adhesive films which are attached in a pull-off fashion, the adhesive film having a non-adhesive side on the carrier.

23. The splicing aid of claim 14 wherein the detachable adhesive strips are attached on the carrier by ultrasonic welding.

24. The splicing aid of claim 14 wherein the adhesive strips are attached on the carrier with less adhesion than is on their upper side facing away from the carrier.

25. The splicing aid of claim 14 wherein the carrier is provided in a magazine as a belt on a roller and is cut to size as strips as required.

26. The splicing aid of claim 14 wherein the carrier is ready made to a suitable length.

* * * * *